(12) United States Patent
Saneyoshi et al.

(10) Patent No.: US 11,750,115 B2
(45) Date of Patent: Sep. 5, 2023

(54) STACKED ELECTROSTATIC ACTUATOR (71) Applicant: STRAWB Inc., Kanagawa (JP)

(72) Inventors: Keiji Saneyoshi, Kanagawa (JP); Makoto Ito, Kanagawa (JP); Hikaru Izumitani, Kanagawa (JP)

(73) Assignee: STRAWB INC., Kanagawa (JP)

( * ) Notice: Subject to any disclaimer, the term of this patent is extended or adjusted under 35 U.S.C. 154(b) by 87 days.

(21) Appl. No.: 17/614,671

(22) PCT Filed: May 20, 2020

(86) PCT No.: PCT/JP2020/019838
§ 371 (c)(1),
(2) Date: Nov. 29, 2021

(87) PCT Pub. No.: WO2020/241386
PCT Pub. Date: Dec. 3, 2020

(65) Prior Publication Data
US 2022/0224252 A1 Jul. 14, 2022

(30) Foreign Application Priority Data
May 31, 2019 (JP) .................................. 2019-102852

(51) Int. Cl.
*H02N 1/00* (2006.01)
*B81B 3/00* (2006.01)

(52) U.S. Cl.
CPC ........... *H02N 1/004* (2013.01); *B81B 3/0021* (2013.01); *B81B 2203/04* (2013.01)

(58) Field of Classification Search
CPC .......... H02N 1/00; H02N 1/004; H02N 1/006; H02N 1/008; B81B 3/0021; B81B 2203/04; B81B 2203/053
See application file for complete search history.

(56) References Cited

U.S. PATENT DOCUMENTS

| 2,975,307 A | * | 3/1961 | Schroeder | ............... | H02N 1/006 |
| | | | | | 310/309 |
| 6,255,758 B1 | * | 7/2001 | Cabuz | .................... | H02N 1/006 |
| | | | | | 29/25.35 |

(Continued)

FOREIGN PATENT DOCUMENTS

| EP | 3324533 A1 | 5/2018 |
| JP | 2013017287 A | 1/2013 |
| JP | 2013243805 A | 12/2013 |

OTHER PUBLICATIONS

M. Ito and K. Saneyoshi, "An attempt to make a large-scale stacked-type electrostatic actuator for artificial muscles of robots," 2012 IEEE International Conference on Robotics and Biomimetics (ROBIO), Guangzhou, China, 2012, pp. 1182-1187, doi: 10.1109/ROBIO.2012.6491130. (Year: 2012).*

(Continued)

*Primary Examiner* — Burton S Mullins
(74) *Attorney, Agent, or Firm* — SNELL & WILMER L.L.P.

(57) ABSTRACT

A stacked electrostatic actuator exhibits a sufficient contraction force even when pulled by a large external force and the contraction rate thereof does not decrease even under a light load. A stacked electrostatic actuator includes a plurality of electrode films each including a three-layer structure including a first insulating layer, a conductor layer, and a second insulating layer.

8 Claims, 7 Drawing Sheets

(56) References Cited

U.S. PATENT DOCUMENTS

| | | | |
|---|---|---|---|
| 6,420,814 B1* | 7/2002 | Bobbio | H02N 1/006 |
| | | | 310/309 |
| 6,646,364 B1 | 11/2003 | Horning et al. | |
| 7,732,999 B2* | 6/2010 | Clausen | H10N 30/098 |
| | | | 310/369 |
| 7,868,516 B2* | 1/2011 | Takahashi | H02N 1/004 |
| | | | 310/309 |
| 2018/0294743 A1* | 10/2018 | Saneyoshi | B32B 7/12 |

OTHER PUBLICATIONS

M. Ito and K. Saneyoshi, "Study of the contraction characteristics of a large-scale stacked-type electrostatic actuator," IECON 2013—39th Annual Conference of the IEEE Industrial Electronics Society, Vienna, Austria, 2013, pp. 4005-4010, doi: 10.1109/IECON.2013.6699776. (Year: 2013).*

International Search Report issued in PCT/JP2020/019838 dated Aug. 11, 2020.

* cited by examiner

HT   THICKNESS OF HINGE PORTION
HL   WIDTH OF HINGE
RH   CURVATURE RADIUS AT CENTER OF
     WIDTH OF HINGE PORTION
θOA  OPENING ANGLE

STACKED ELECTROSTATIC ACTUATOR

CROSS-REFERENCE TO RELATED APPLICATIONS

This application is a national stage application of PCT/JP2020/019838, filed on May 20, 2020, entitled "STACKED ELECTROSTATIC ACTUATOR," which claims priority to JP Application No. 2019-102852, filed on May 31, 2019, both of which are hereby incorporated by reference in their entirety for all purposes.

TECHNICAL FIELD

The present invention relates to a stacked electrostatic actuator.

BACKGROUND ART

There is a technique disclosed in a patent publication related to a stacked electrostatic actuator including a plurality of first electrode plates in each of which an adhesive is applied on one surface in a first pattern, and a plurality of second electrode plates in each of which an adhesive is applied on one surface in a second pattern which is different from the first pattern, in which the plurality of first electrode plates and the plurality of second electrode plates are alternately stacked without causing the surfaces on which the adhesive is applied to face each other (PTL 1).

CITATION LIST

Patent Literature

PTL 1: Japanese Patent Application Publication No. 2017-22926 A

SUMMARY OF INVENTION

Technical Problem

The conventional stacked electrostatic actuator is disadvantageous in that, when pulled by a large external force, the electrode interval becomes excessively large, and a sufficient electrostatic attraction, that is, a contraction force cannot be provided. A structure in which a hard elastic material is used to suppress excessively large electrode interval in view of such a disadvantage is disadvantageous in that under a light load, the electrode interval does not become large and the contraction rate of the actuator decreases. An actuator includes very thin electrode plates, and it is difficult to physically suppress the increase of the electrode interval.

The inventor has found that it is possible to achieve an effect similar to the spring effect of a disc spring by devising the shape of the hinge portions instead of physically suppressing the excessive increase of the electrode interval, and has reached the present invention. An object of the present invention is to provide a stacked electrostatic actuator that exhibits a sufficient contraction force even when pulled by a large external force and the contraction rate thereof does not decrease even under a light load.

Solution to Problem

In order to solve the above-described disadvantage, a stacked electrostatic actuator according to Claim 1 is a stacked electrostatic actuator including a plurality of electrode films each including a three-layer structure including a first insulating layer, a conductor layer, and a second insulating layer, wherein each of the electrode films includes, on the first insulating layer of the electrode film, a bonding region P subjected to surface processing so as to be bonded to another electrode film and a non-bonding region Q not bonded to the another electrode film, and a boundary C between the bonding region P and the non-bonding region Q has a wavy pattern that can be defined using at least one curvature radius of a finite value, and the bonding region P of a first electrode film and the bonding region P of a second electrode film immediately below the first electrode film are stacked and arranged such that the bonding regions do not overlap each other in a stacking direction and that an axis of the wavy pattern of the boundary C of the first electrode film and an axis of the wavy pattern of the boundary C of the second electrode film are parallel to each other, and the first electrode film and the second electrode film are bonded by the bonding region P of the first insulating layer of the second electrode film, so that the plurality of electrode films has electrode portions where the two electrode films are bonded and hinge portions where the two electrode films are not bonded when viewed from the stacking direction, and when the stacked electrostatic actuator is pulled in the stacking direction by an external force, the hinge portions are elastically deformed to separate the electrode portions from each other and the stacked electrostatic actuator extends in the stacking direction, and when a voltage is applied between the conductor layers of the plurality of electrode films, a distance between the electrode portions separated from each other is reduced by electrostatic force so that the stacked electrostatic actuator contracts in the stacking direction.

In order to solve the above-described disadvantage, a stacked electrostatic actuator according to Claim 2 is a stacked electrostatic actuator including a plurality of electrode films each including a three-layer structure including a first insulating layer, a conductor layer, and a second insulating layer, wherein each of the electrode films includes, on the first insulating layer of the electrode film, a bonding region P subjected to surface processing so as to be bonded to another electrode film and a non-bonding region Q not bonded to the another electrode film, and the bonding region P is formed in a weight connection pattern including weight shapes separated from each other on the first insulating layer, and the weight shapes on the first insulating layer of a first electrode film and the weight shapes on the first insulating layer of a second electrode film immediately below the first electrode film are stacked and arranged such that the weight shapes do not overlap each other in a stacking direction and that the weight shapes and in orientations such that the weight shapes are rotated by 90 degrees from each other, and the first electrode film and the second electrode film are bonded by the bonding region P of the first insulating layer of the second electrode film, so that the plurality of electrode films has electrode portions where the two electrode films are bonded and hinge portions where the two electrode films are not bonded when viewed from the stacking direction, and when the stacked electrostatic actuator is pulled in the stacking direction by an external force, the hinge portions are elastically deformed to separate electrode portions from each other and the stacked electrostatic actuator extends in the stacking direction, and when a voltage is applied between the conductor layers of the plurality of electrode films, a distance between electrode portions separated from each other is reduced by electrostatic force so that the stacked electrostatic actuator contracts in the stacking direction.

The stacked electrostatic actuator according to Claim 3 is the stacked electrostatic actuator according to Claim 1 or 2, wherein the hinge portions of each of the electrode films are formed as arcuate regions having a curvature radius $R_e$ of an outer periphery and a curvature radius $R_i$ of an inner periphery, and the arcuate regions each have a shape in which arcs are continuously connected while changing a curvature orientation for each opening angle $\theta_{OA}$ of the arcuate region.

The stacked electrostatic actuator according to Claim 4 is the stacked electrostatic actuator according to Claim 1, wherein the hinge portions of each of the electrode films are formed as arcuate regions having a curvature radius $R_e$ of an outer periphery and a curvature radius $R_i$ of an inner periphery, and an opening angle $\theta_{OA}$ of the arcuate region is 180 degrees or more.

The stacked electrostatic actuator according to Claim 5 is the stacked electrostatic actuator according to any one of Claims 1 to 4, wherein with definition of a movement amount of one boundary C of each of the hinge portion with respect to another boundary C of the hinge portion in an extension/contraction direction of the stacked electrostatic actuator as a displacement of the hinge portion, and definition of a displacement of the hinge portion corresponding to a maximum allowable distance between the facing electrode portions defined by a generated force of the actuator as a maximum displacement, the maximum displacement of the hinge portions is √2 times or more a thickness of each of the electrode films.

The stacked electrostatic actuator according to Claim 6 is the stacked electrostatic actuator according to Claim 1 or 2, wherein the hinge portions have a uniform width.

The stacked electrostatic actuator according to Claim 7 is the stacked electrostatic actuator according to Claim 6, wherein a ratio of the width of the hinge portions to a thickness of the electrode films is 5 or more.

The stacked electrostatic actuator according to Claim 8 is the stacked electrostatic actuator according to Claim 1 or 2, wherein a space formed between two of the electrode films by the corresponding hinge portion is in fluid communication with an outside, and fluid is allowed to flow in and out between the space and the outside when the stacked electrostatic actuator extends and contracts.

Advantageous Effects of Invention

According to the present invention, the hinge portions have a wavy shape, so that it is possible to provide a stacked electrostatic actuator that exhibits a sufficient contraction force even when pulled by a large external force and the contraction rate thereof does not decrease even under a light load.

DESCRIPTION OF EMBODIMENTS

First Embodiment

Figure 1:
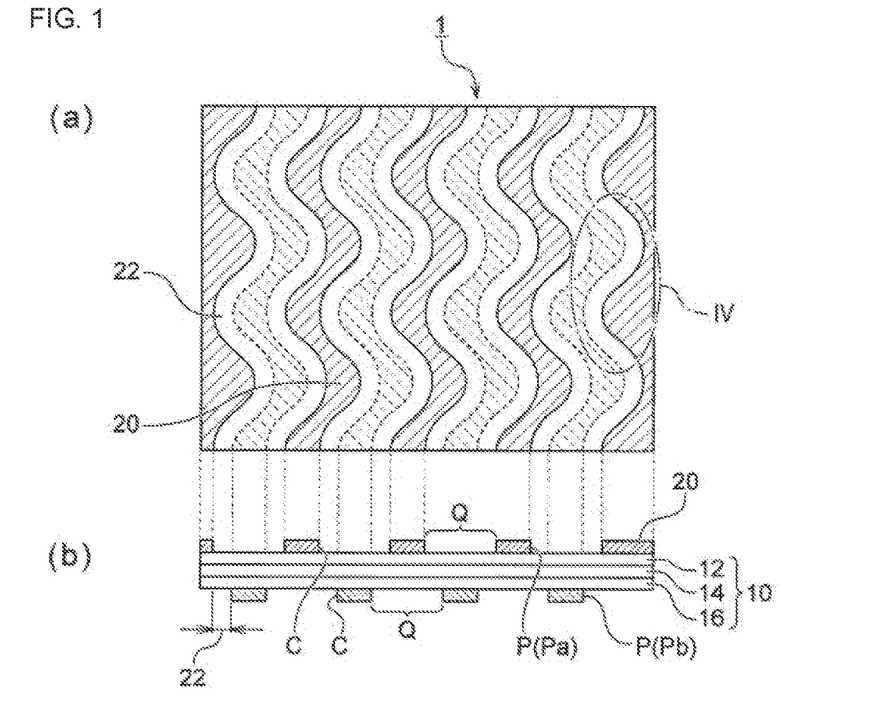
FIG. 1 is an explanatory view of a stacked electrostatic actuator according to a first embodiment.
Figure 2:
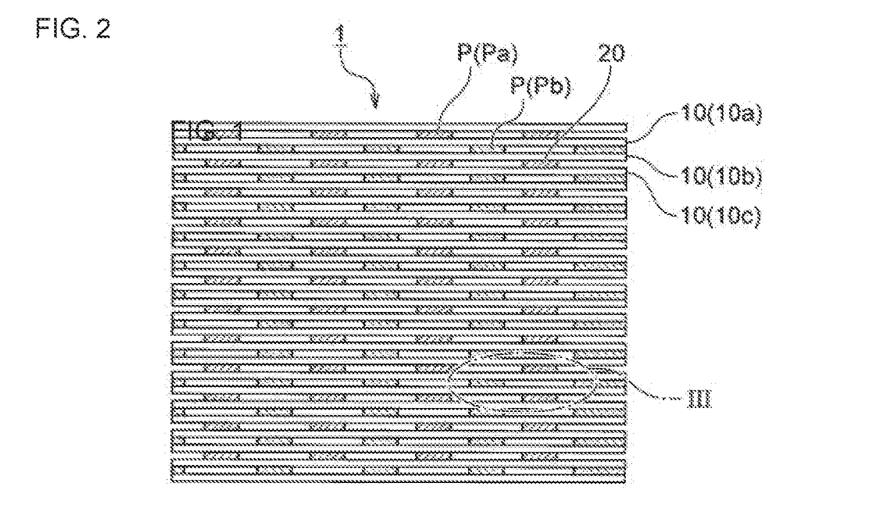
FIG. 2 is a cross-sectional view of the entire actuator illustrated in FIG. 1.

FIG. 1 is an explanatory view of a stacked electrostatic actuator 1 according to a first embodiment. FIG. 1(*a*) illustrates a plane of a stacked electrostatic actuator 1, and FIG. 1(*b*) illustrates a cross section of one layer of an electrode film 10 included in the stacked electrostatic actuator 1. FIG. 2 is a cross-sectional view of the entire stacked electrostatic actuator 1 illustrated in FIG. 1. Here, FIG. 2 is made for the purpose of illustrating a stacked structure of the electrode films 10 and bonding regions P, and thus the three-layer structure (described below) of the electrode film 10 illustrated in FIG. 1(*b*) is not illustrated.

Configuration Outline of Stacked Electrostatic Actuator

The stacked electrostatic actuator 1 is configured by stacking and bonding a large number of the electrode films 10 sandwiched between two end members (not illustrated) with bonding portions 20 interposed therebetween (FIG. 2, described below). As illustrated in FIG. 1(*b*), the electrode film 10 has a three-layer structure of a first insulating layer 12, a conductor layer 14, and a second insulating layer 16. The conductor layer 14 is made of, for example, a metal film of copper or the like, a conductive polymer, or a conductive carbon allotrope (or a conductive mixture mainly including carbon), and the first and second insulating layers 12 and 16 are made of an insulating polymer film. In particular, when high withstand voltage is required for the first and second insulating layers 12 and 16, it is desirable to use a high withstand voltage insulator such as parylene (registered trademark), but the present invention is not limited thereto. The thickness of the electrode film 10 is, for example, several micrometers. The first insulating layer 12 and the second insulating layer 16 have bonding regions P on which surface processing is performed so that the first insulating layer 12 can be bonded to the second insulating layer of another electrode film, and the second insulating layer 16 can be bonded to the first insulating layer of still another electrode film (see FIG. 2). As the surface processing method, an adhesive may be applied onto the first insulating layer 12 to form an adhesive portion, or a bonding layer may be formed by a chemical treatment such as a silane coupling agent treatment. In the case of forming an adhesive portion, the two electrode films are bonded to each other via an adhesive, and in the case of forming the bonding layer by chemical treatment, the two electrode films are covalently bonded to each other.

As illustrated in FIG. 1(b), each of the electrode films 10 has, in addition to the bonding regions P, non-bonding regions Q on which surface processing for bonding to another electrode film (see FIG. 2) is not performed on the first insulating layer 12, and a boundary C between the bonding region P and the non-bonding region Q has a wavy pattern that can be defined using at least one finite curvature radius (see FIG. 1(a)). At this time, the bonding regions P are arranged such that the interval (that is, the width of the non-bonding regions Q) between two adjacent bonding regions P is larger than the width of the bonding regions P. Here, in FIG. 1(a), the outlines of bonding regions Pa on the first insulating layer 12a of a certain electrode film (hereinafter referred to as "first electrode film 10a") are indicated by solid lines, and the outlines of bonding regions Pb below a second insulating layer 16a (on the first insulating layer 12b of an electrode film below the first electrode film 10a (hereinafter referred to as "second electrode film 10b")) are indicated by a broken lines (described below).

As illustrated in FIG. 2, the bonding regions Pa on the first electrode film 10a and the bonding regions Pb (bonding regions below the first electrode film 10a) on the second electrode film 10b are stacked and arranged in such a manner that the bonding regions Pa and the bonding regions Pb do not overlap each other in the stacking direction, and the first electrode film 10a and the second electrode film 10b are bonded by the bonding regions Pb on the second electrode film 10b. As described above, in the first electrode film 10a, the bonding regions Pa are formed such that the interval (that is, the width of the non-bonding regions) between two adjacent bonding region Pa is larger than the width of the bonding region Pa, so that when the stacked electrostatic actuator 1 is viewed from the stacking direction, regions that are not bonded to the second electrode film 10b is formed (FIG. 1(a)). Hereinafter, these regions are defined as hinge portions 22. At this time, as illustrated in FIG. 1(a), the wavy pattern of the boundary C on the first electrode film 10a and the wavy pattern of the boundary C on the second electrode film 10b, which are located on both sides of each of the hinge portions 22, are arranged such that their axes are parallel to each other.

Operation Outline of Stacked Electrostatic Actuator

Figure 3:
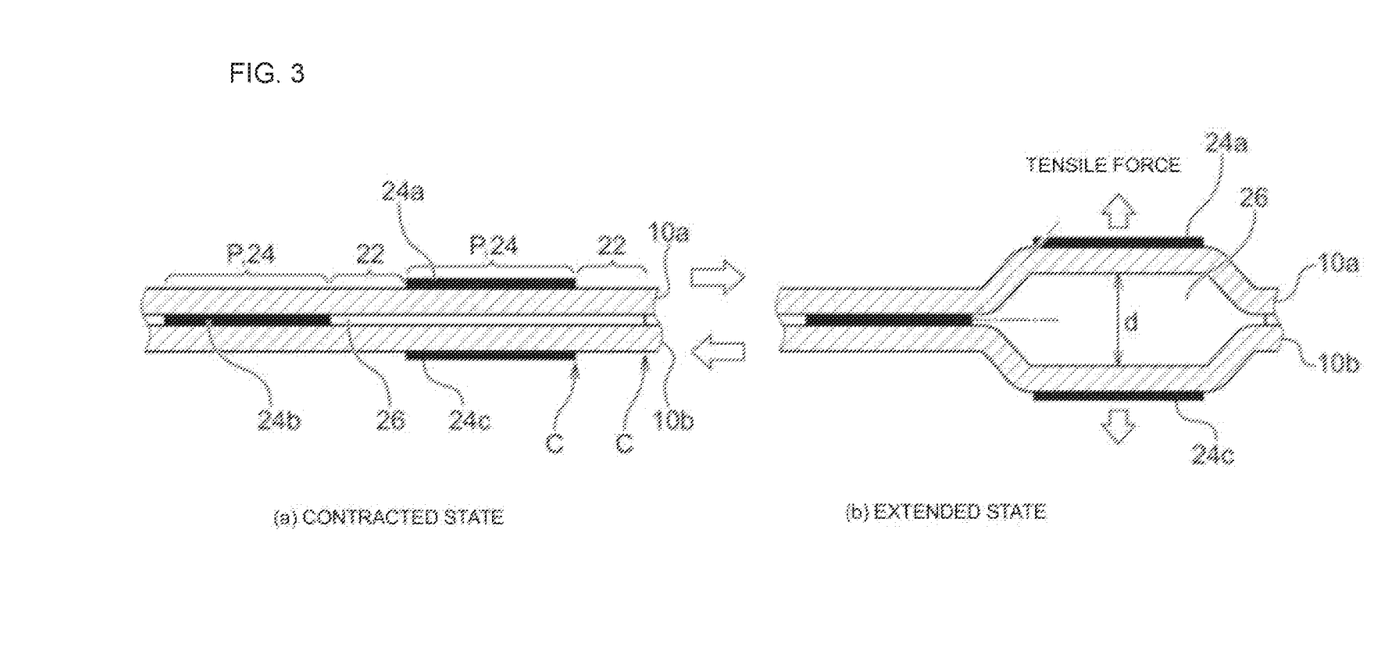
FIG. 3 is an enlarged cross-sectional view of a region III circled in FIG. 2, and are explanatory views for describing the operation of the actuator.

FIG. 3 is an enlarged cross-sectional view of a region III circled in FIG. 2, and are explanatory views for describing the operation of the stacked electrostatic actuator 1. FIG. 3(a) illustrates a state in which a voltage is applied between the conductor layers and the interval between the electrode films is reduced, and FIG. 3(b) illustrates a state in which an external force in a direction of separating the stacked layers acts between the two end members (not illustrated) and the interval between the electrode films is increased.

As illustrated in FIG. 3(a), in the bonding region P, the first and second electrode films 10a and 10b are bonded and integrated, so that the bonding region P has a higher rigidity than that of the hinge portions 22 and the bonding region P is hard. When the bonding region P and the two electrode films 10a and 10b bonded by the bonding region P are defined as an electrode portion 24, the moment of the force due to an external force acting on the electrode portions 24 in the stacking direction is substantially 0 except for the electrode portions near the end members (not illustrated) of the stacked electrostatic actuator 1 in particular, so that the electrode portions 24 are hardly deformed. On the other hand, in the hinge portions 22, the electrode films 10 are arranged as single layers, so that the hinge portions 22 have lower rigidity than the electrode portions 24. Furthermore, since the moment of the force acting on each of the hinge portions 22 in the stacking direction due to the external force is not 0, that is, the force generated at one boundary C of each of the hinge portions 22 and the force generated at the other boundary C are in opposite directions to each other, the hinge portions 22 are more easily deformed than the electrode portions 24. For the above-described reasons, when receiving an external force in a direction of separating each pair of the electrode films 10a and 10b from each other, the hinge portions 22 are elastically deformed, and the interval between the first electrode film 10a and the second electrode film 10b is increased to form a space 26 (FIG. 3(b)). As illustrated in FIG. 2, the bonding regions P are arranged in a check pattern, the spaces 26 formed between the electrode films 10a and 10b are also arranged in a check pattern. When a voltage is applied between the conductor layers of the first and second electrode films 10a and 10b in the extended state illustrated in FIG. 3(b), an electrostatic attraction is generated between the first and second electrode films 10a and 10b to attract opposing electrode portions 24a and 24c to each other, and the space 26 is contracted in the stacking direction (to be the contracted state illustrated in FIG. 3(a)). As a result, the stacked electrostatic actuator 1 contracts in the stacking direction against the external force. Conversely, when the voltage between the conductor layers is set to 0, the hinge portions 22 are elastically deformed by the external force, and the intervals between the electrode portions 24a and 24c are increased (returns to the extended state illustrated in FIG. 3(b)). Therefore, the stacked electrostatic actuator 1 can be extended and contracted by turning on/off the applied voltage.

Effect of Present Embodiment

In the stacked electrostatic actuator 1, the distance between the electrode portions 24a and 24c (height of the spaces 26 formed between the electrode films 10a and 10b) when an external force is applied (in the extended state), that is, the d value in FIG. 3(b) varies depending on the degree of bending of the hinge portions 22. Here, according to Coulomb's law, the electrostatic attraction between the two electrode portions 24a and 24c is inversely proportional to the square of the distance d between the electrode portions 24a and 24c. Thus, when the distance d between the electrode portions 24a and 24c increases, the electrostatic attraction rapidly decreases, and the contraction force of the stacked electrostatic actuator 1 is also reduced. Therefore, in order to maintain the contraction force of the stacked electrostatic actuator 1, it is necessary to suppress the distance d between the electrode portions 24a and 24c in the extended state. On the other hand, in a structure in which a hard elastic material is used for the electrode films 10a and 10b to suppress the distance d between the electrode portions 24a and 24c, the distance d between the electrode portions 24a and 24c is not sufficiently increased under a light load, and the contraction rate of the stacked electrostatic actuator 1 decreases. Since the above discussion holds at all the electrode portions 24 in the respective layers of the stacked electrode films 10a and 10b, it is difficult to form, between the electrode portions 24a and 24c of every layer, a structure that causes the electrode portions 24a and 24c to collide with something when the distance d is a predetermined value to suppress increase of the distance d and that is made from a separate member or the like. Therefore, in the present invention, the shape of the hinge portions 22 is controlled to control the spring characteristic.

In the stacked electrostatic actuator 1 according to the first embodiment, the hinge portions 22 have a wavy pattern. Specifically, structures that are cut out from a disc spring with an opening angle of, for example, $\theta_{OA}$ that are continuously connected while changing the curvature orientation for each of the structures to form each of the hinge portions 22 so that the hinge portion 22 has a curvature (see FIG. 4 to be described below). As a result, the hinge portions 22 can achieve an effect similar to that of the spring effect of a disc spring.

It is known that the relational equation between the spring force F of the disc spring and the deflection (shrinkage) S is expressed by the following Almen-Laszlo's equation.

$$F = k \times \left( \frac{\delta^3}{2t^2} + \delta \right) \qquad \text{Formula 11}$$

In the equation, t represents the thickness of the disc spring, and k is a coefficient determined from the shape of the disc spring and material physical properties such as Young's modulus and Poisson's ratio.

When replacing parameters for the hinge portions 22 of the stacked electrostatic actuator 1, t is the thickness of the electrode film 10, and δ is a displacement of one boundary C with respect to the other boundary C of each hinge portion 22 (a displacement of the stacked electrostatic actuator 1 in the stacking direction). Hereinafter, δ is referred to as a displacement of the hinge portions 22 or simply as a displacement. Here, the state of δ=0 (hereinafter, it is referred to as a state of displacement 0) is defined as a state in which the hinge portions 22 and the electrode portions 24 arranged on one electrode film 10 are positioned on one plane as illustrated in FIG. 3(a). Since each hinge portion 22 of the present invention has a partial disc spring structure having a curvature, Almen-Laszlo's equation approximately holds between the spring force F generated in the hinge portion 22 and the displacement δ of the hinge portion 22. Since the first term in the parenthesis of the right side of the above-described equation is the $\delta^3$ proportional term and the second term is the S proportional term, it can be seen that the drive range of the stacked electrostatic actuator 1 includes a cubic functional spring characteristic region.

In a case where the hinge portions 22 have such a spring characteristic, the hinge portions 22 when the stacked electrostatic actuator 1 starts to extend from the state of displacement 0 are easily deformed due to an external force, but the $\delta^3$ proportional term rapidly increases as the displacement increases, so that the hinge portions 22 are rapidly hardened. Therefore, it is possible to provide the stacked electrostatic actuator 1 in which even when the stacked electrostatic actuator 1 is pulled by a large external force, the excessive increase of the distance d between the electrode portions 24a and 24c is suppressed by the $\delta^3$ proportional term, a sufficient contraction force is exhibited, and the contraction rate does not decrease even under a light load since the $\delta^3$ proportional term is very small at the beginning of extension from the state of displacement 0.

The first term ($\delta^3$ proportional term) becomes larger than the second term (S proportional term) when ($\delta^3$ proportional term)>(δ proportional term) holds, that is, when $\delta$>($\sqrt{2}$)t. That is, when the maximum value of the distance d between the electrode portions 24a and 24c defined by the electrostatic attraction of the stacked electrostatic actuator 1 is defined as $d_{max}$, and the maximum value of the displacement δ of each hinge portion 22 corresponding to the maximum value $d_{max}$ of the distance d between the electrode portions 24a and 24c is defined as the maximum displacement $\delta_{max}$, the spring characteristic utilizing the effect of the $\delta^3$ proportional term can be provided by designing the thickness t of the electrode film 10 such that the maximum displacement $\delta_{max}$ of the hinge portion 22 is equal to or more than $\sqrt{2}$ times the thickness t of the electrode film 10. Note that the distance d between the electrode portions 24a and 24c and the displacement δ of one hinge portion 22 are expressed by a relationship of d=2δ.

Figure 4:
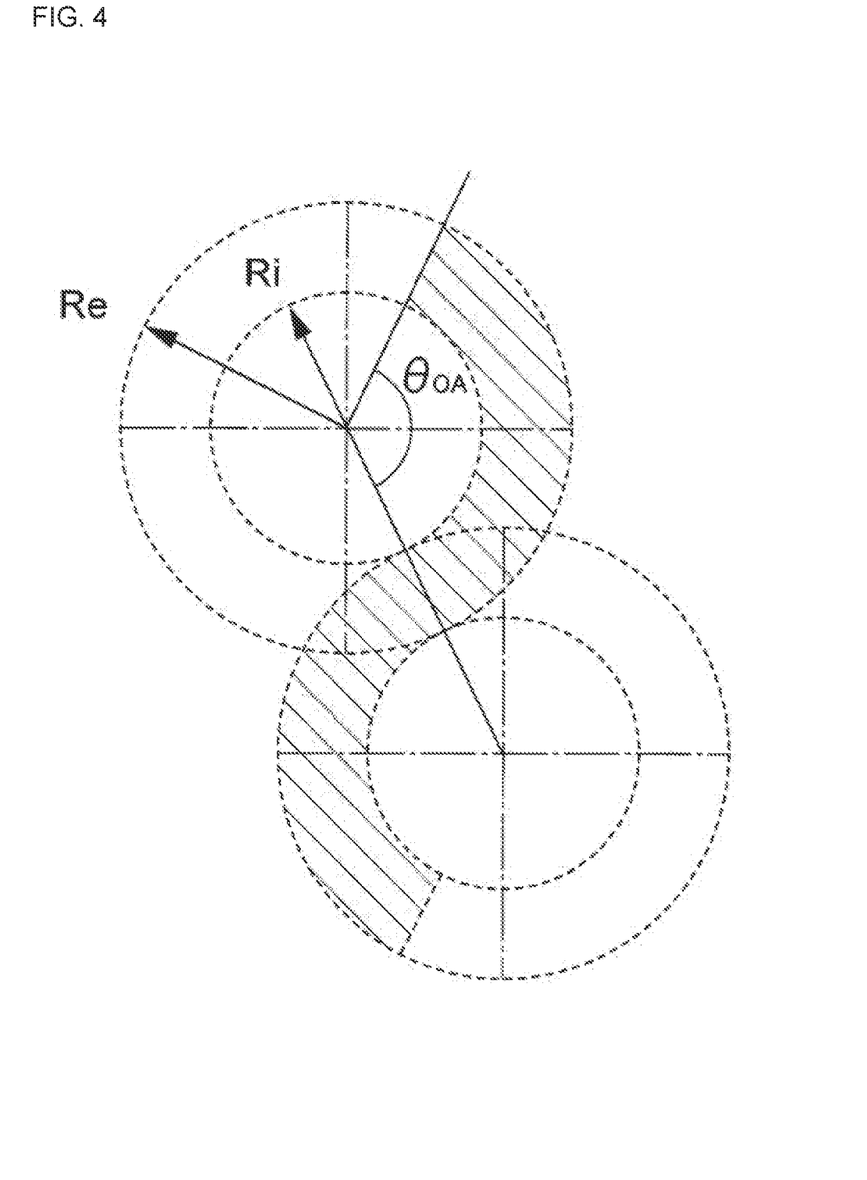
FIG. 4 is a view obtained by extracting a region IV surrounded by a circle in FIG. 1(*a*), and is a view for describing a wavy pattern of a hinge portion.

FIG. 4 is a view obtained by extracting a region IV surrounded by a circle in FIG. 1(a), and is a view for describing a wavy pattern of the hinge portion 22. The wavy pattern of the hinge portion 22 is a pattern having a shape in which arcs having an outer diameter $R_e$ and an inner diameter $R_i$ are continuously connected while changing the curvature orientation for each opening angle $\theta_{OA}$. Since the curvature is constant (the curvature radius is a constant of either the outer diameter $R_e$ or the inner diameter $R_i$) at every boundary C, stress concentration of the hinge portion 22 at the time of deformation is small, and thus, the reliability of the stacked electrostatic actuator 1 can be improved.

When the opening angle $\delta_{OA}$ of the arcs of the wavy pattern of the hinge portions 22 is 180 degrees or more (FIG. 6, described below), the increase in the spring constant of the hinge portions 22 becomes large according to the increase in the distance d between the electrode portions 24a and 24c, so that a larger stroke is provided under a light load, and excessive increase of the distance d between the electrode portions 24a and 24c can be suppressed under a heavy load.

Figure 5:
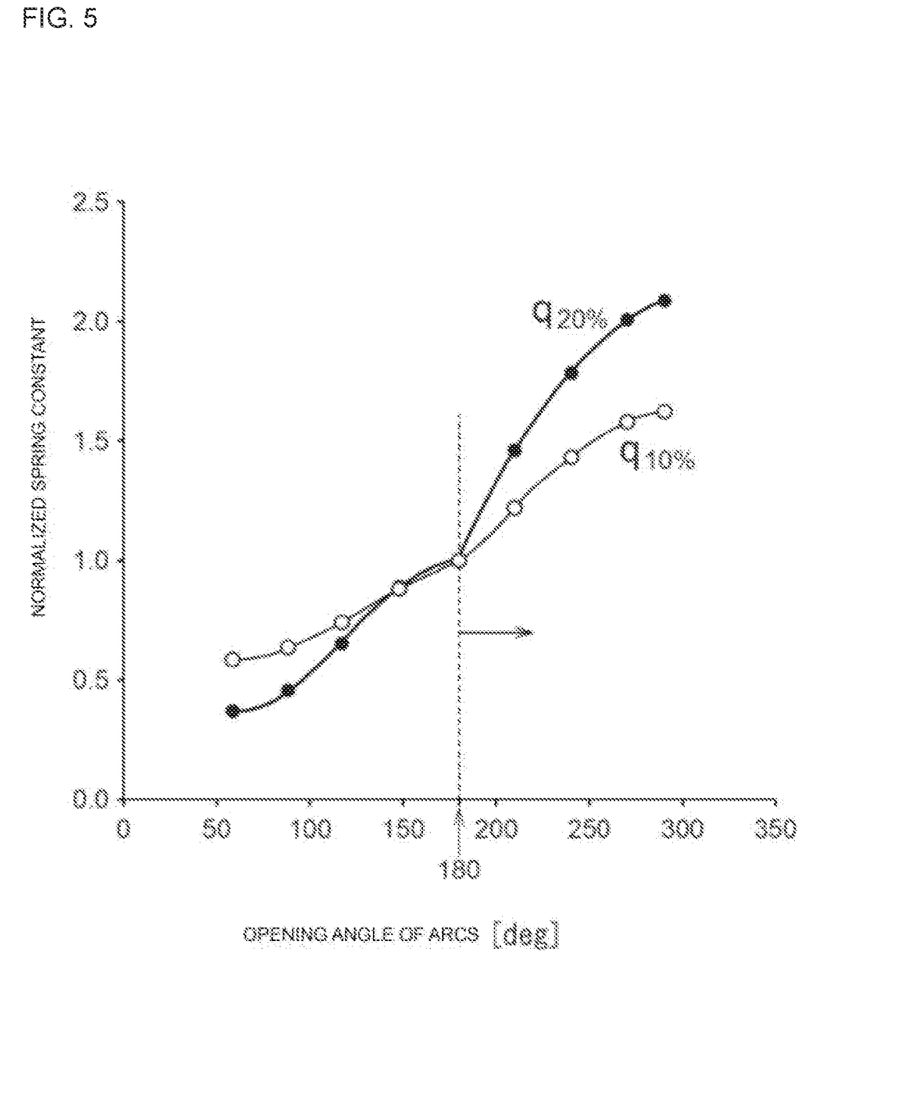
FIG. 5 is a diagram illustrating an analysis result of a spring constant of the hinge portion.

Here. FIG. 5 is a diagram illustrating an analysis result of the spring constant of the hinge portion 22. The horizontal axis represents the opening angle $\theta_{OA}$ of the arcs, and the vertical axis represents the spring constant of the hinge portion 22 normalized by the value when the opening angle $\theta_{OA}$ of the arcs is 180 degrees. The spring constants at the displacement of 0 are all the same. In the figure, $q_{10\%}$ and $q_{20\%}$ are spring constants when the displacement S of the hinge portion 22 is displaced by 10% and 20% with respect to the width $H_L$ (=outer diameter $R_e$−inner diameter $R_i$) of the hinge portion 22, respectively. From FIG. 5, it can be seen that the spring constant at the time of deformation of the hinge portion 22 rapidly increases when the opening angle $\theta_{OA}$ of arcs forming the shape is 180 degrees as a boundary. That is, it can be seen that when the opening angle $\theta_{OA}$ of the arcs is larger than 180 degrees, the stacked electrostatic actuator 1 is soft and easily deformed at the beginning of extension to provide a large stroke, and rapidly becomes hard as the stacked electrostatic actuator 1 extends to suppress the excessive increase of the distance d between the electrode portions 24a and 24c.

Figure 6:
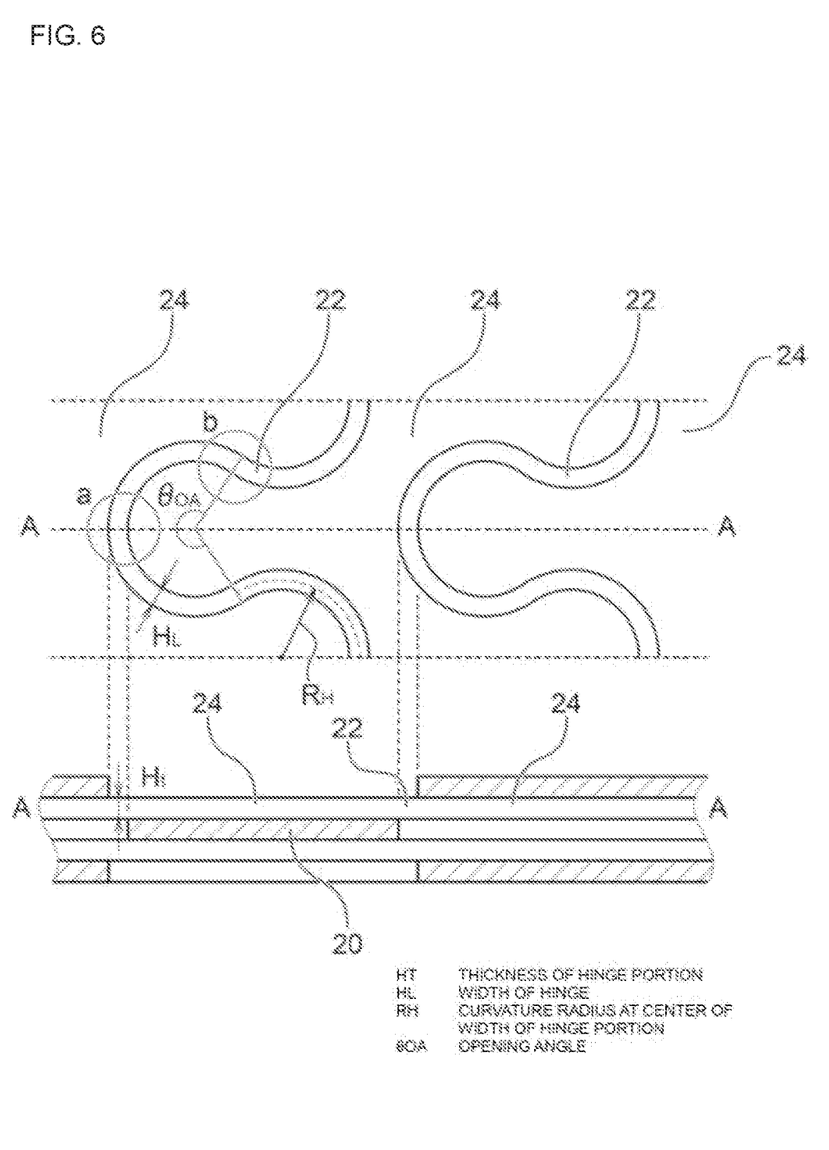
FIG. 6 is a view for describing a deformation mode of the hinge portion when the opening angle $\theta_{OA}$ of the arcs of the wavy pattern of the hinge portion is 180 degrees.

FIG. 6 is a view for describing a deformation mode of the hinge portion 22 when the opening angle $\theta_{OA}$ of the arcs of the wavy pattern of the hinge portion 22 is 180 degrees or more. When the stacked electrostatic actuator 1 extends, a region a surrounded by a circle in FIG. 6 mainly undergoes shear deformation and bending deformation. When the opening angle $\theta_{OA}$ of the arcs is 180 degrees or more, a region b newly appears. Since the region b also receives a tensile force in addition to the shear force and the bending moment, the deformation mode of the hinge portion 22 changes due to the existence of the region b, and when the hinge portion 22 is greatly deformed, the spring constant increases ($q_{10\%}$, $q_{20\%}$, and the like). That is, it can be understood that when the opening angle $\theta_{OA}$ of the arcs is 180 degrees or more, the characteristic of the hinge portion 22 becomes closer to the disc spring structure.

Figure 7:
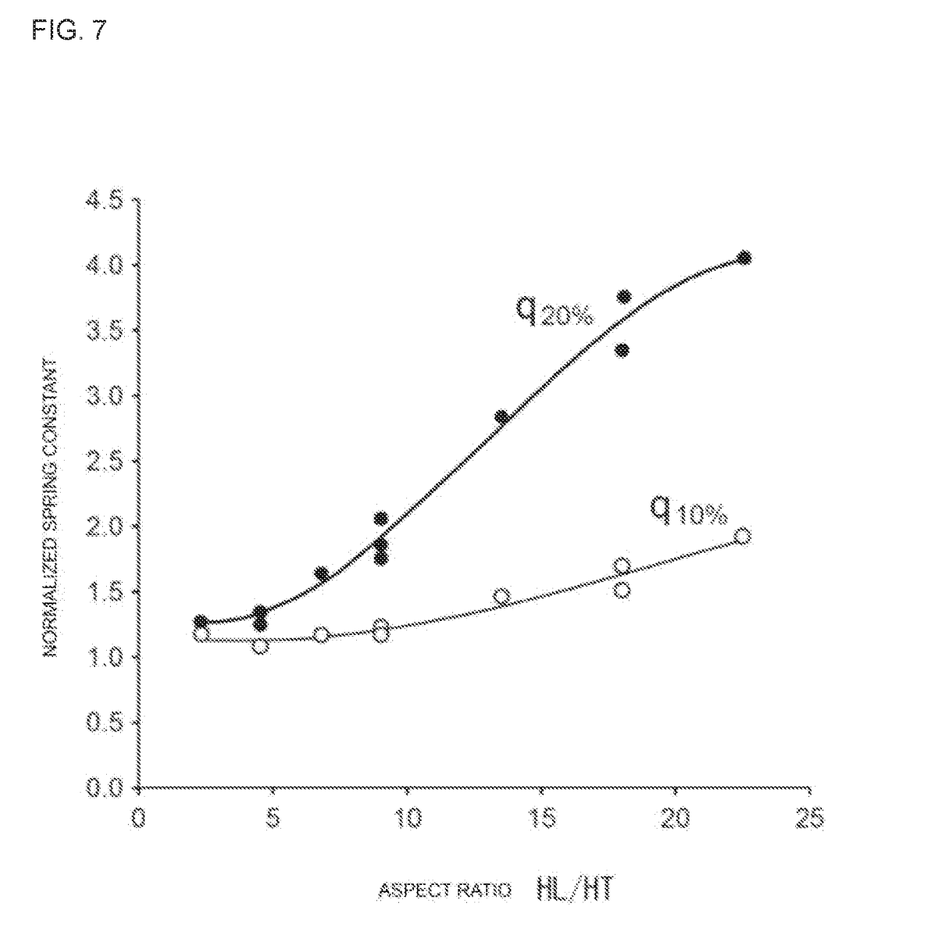
FIG. 7 is a diagram illustrating an analysis result of a spring constant of the hinge portion.

FIG. 7 is a diagram illustrating an analysis result of the spring constant of the hinge portion 22. The horizontal axis represents the ratio (aspect ratio) $H_L/H_T$ of the width $H_L$ of the hinge portion 22 to the thickness $H_T$ (thickness of the electrode film) of the hinge portion 22, and the vertical axis represents the spring constant of the hinge portion 22 normalized by the value of the spring constant when the displacement is 0. The spring constants at the displacement of 0 are all the same. In the figure, $q_{10\%}$ and $q_{20\%}$ are spring constants when the displacement δ of the hinge portion 22 is displaced by 10% and 20% with respect to the width $H_L$ of the hinge portion 22, respectively. From FIG. 7, it can be seen that the spring constant at 20% displacement rapidly increases when the aspect ratio $H_L/H_T$ of the shape is 5 as a boundary. Tat is, it can be seen that when the aspect ratio $H_L/H_T$ is 5 or more, the stacked electrostatic actuator 1 is soft and easily deformed at the beginning of extension to provide a large stroke, and rapidly becomes hard as the stacked electrostatic actuator 1 extends to suppress the excessive increase of the distance d between the electrode portions 24a and 24c.

In the stacked electrostatic actuator 1, the hinge portion 22 may have a uniform width. In a case where the width of the hinge portion is not uniform, when the stacked electrostatic actuator extends, a portion having a narrow width of the hinge portion first extends to support most of the load, and the stacked electrostatic actuator may be broken due to stress concentration. On the other hand, by forming the hinge portion 22 to have a uniform width, stress concentration at the hinge portion 22 can be alleviated, and the risk of breakage can be reduced.

In addition, in a structure in which the spaces formed between the stacked electrode portions are sealed, fluid cannot flow in and out between the space and the outside when the stacked electrostatic actuator extends and contracts, and the extension and contraction operation may be hindered (see, for example, FIG. 1 of Patent Literature 1). On the other hand, in the stacked electrostatic actuator 1 according to the first embodiment, as illustrated in FIG. 1, the hinge portion 22 forms a wavy pattern and is in fluid communication with the outside, so that it is possible to allow fluid to flow in and out between the space 26 (see FIG. 3) between the electrode portions 24a and 24c and the outside during extension and contraction of the stacked electrostatic actuator 1, and a sufficient extension and contraction amount can be secured without hindering the extension and contraction operation.

Second Embodiment

Figure 8:
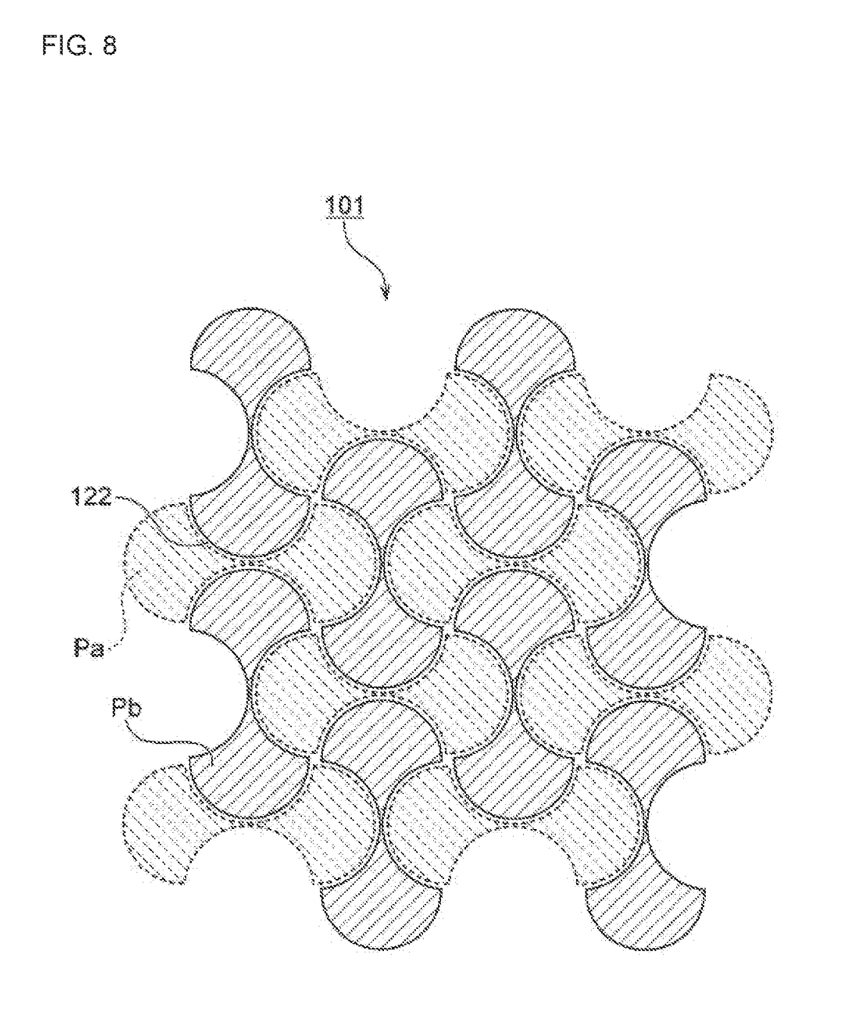
FIG. 8 is a plan view of a stacked electrostatic actuator according to a second embodiment.

FIG. 8 is a plan view of a stacked electrostatic actuator 101 according to a second embodiment. The same or similar elements as those of the stacked electrostatic actuator 1 according to the first embodiment are denoted by the same or similar reference signs, and the description thereof will not be repeated. As illustrated in FIG. 8, in the first electrode film, first bonding regions Pa on which surface processing is performed are formed on a first insulating layer in a weight connection pattern including weight shapes separated from each other on the first insulating layer. In a second electrode film immediately below the first electrode film, second bonding regions Pb on which surface processing is performed are formed on the first insulating layer in the weight connection pattern including weight shapes separated from each other on the first insulating layer. Here, as illustrated in FIG. 8, the weight shape is a shape formed by cutting out a part of the outer periphery from a circle, or a shape formed by constricting a part of the circumference toward the center. Then, the weight shapes of the first electrode film and the weight shapes of the second electrode film are stacked and arranged such that they do not overlap each other in the stacking direction and in orientations such that the weight shapes are rotated by 90 degrees from each other. As a result, in the weight connection pattern, a non-bonding region Q that is not bonded to another electrode film forms a hinge portion 122 of a wavy pattern. The hinge portion 122 has a uniform width, and the axes of the wavy patterns cross each other in orientations such that the axes are rotated by 90 degrees from each other (the wavy patterns extend vertically and horizontally). The first bonding region Pa and the second bonding region Pb move in opposite directions with respect to the stacking direction when the stacked electrostatic actuator 101 extends and contracts. Since the stacked electrostatic actuator 101 according to the second embodiment has two intersecting wavy patterns in a weight connection pattern, the hinge portion 122 can achieve an effect similar to that of the spring effect of a disc spring as described in the first embodiment.

Furthermore, since the stacked electrostatic actuator 101 according to the second embodiment has two intersecting wavy patterns, when the actuator 101 is deformed by receiving an external force, the hinge portion 122 receives a tensile force in addition to a shear force and a bending moment, and thus spring constants ($q_{10\%}$, $q_{20\%}$, and the like) when the hinge portion 22 is greatly deformed increase. That is, it can be seen that, in the stacked electrostatic actuator 101 according to the second embodiment, the two intersecting wavy patterns can achieve almost the same effect as that of the stacked electrostatic actuator 1 according to the first embodiment when the opening angle $θ_{OA}$ of the arcs of the wavy pattern of the hinge portion 22 is set to 180 degrees or more, and the characteristic of the hinge portion 122 is closer to the disc spring structure.

By forming the hinge portion 122 to have a uniform width, stress concentration at the hinge portion 122 can be alleviated, and the risk of breakage can be reduced. In addition, since the hinge portion 122 that is not bonded to another electrode film is in fluid communication with the outside, fluid can flow in and out between the space between the electrode portions and the outside when the stacked electrostatic actuator 101 extends and contracts, and a sufficient amount of extension and contraction can be secured without hindering the extension and contraction operation.

REFERENCE SIGNS LIST

1 Stacked electrostatic actuator
10 Electrode film
10a First electrode film
10b Second electrode film
12, 12a, 12b First insulating layer
14, 14a, 14b Conductor layer
16, 16a Second insulating layer
20 Bonding portion
22 Hinge portion
24, 24a, 24c Electrode portion
26 Space
101 Stacked electrostatic actuator

The invention claimed is:

1. A stacked electrostatic actuator comprising a plurality of electrode films each including a three-layer structure including a first insulating layer, a conductor layer, and a second insulating layer, wherein
each of the electrode films includes, on the first insulating layer of the electrode film, a bonding region P subjected to surface processing so as to be bonded to another electrode film and a non-bonding region Q not bonded to the another electrode film, and a boundary C between the bonding region P and the non-bonding region Q has a wavy pattern that can be defined using at least one curvature radius of a finite value, and the bonding region P of a first electrode film and the bonding region P of a second electrode film immediately below the first electrode film are stacked and arranged such that the bonding regions do not overlap each other in a stacking direction and that an axis of the wavy pattern of the boundary C of the first electrode film and an axis of the wavy pattern of the boundary C of the second electrode film are parallel to each other, and the first electrode film and the second electrode film are bonded by the bonding region P of the first insulating layer of the second electrode film, so that the plurality of electrode films has electrode portions where the two electrode films are bonded and hinge portions where the two electrode films are not bonded when viewed from the stacking direction, and when the stacked electrostatic actuator is pulled in the stacking direction by an external force, the hinge portions are elastically deformed to separate the electrode portions from each other and the stacked electrostatic actuator extends in the stacking direction, and when a voltage is applied between the conductor layers of the plurality of electrode films, a distance between the electrode portions separated from each other is reduced by electrostatic force so that the stacked electrostatic actuator contracts in the stacking direction.

2. A stacked electrostatic actuator comprising a plurality of electrode films each including a three-layer structure including a first insulating layer, a conductor layer, and a second insulating layer, wherein each of the electrode films includes, on the first insulating layer of the electrode film, a bonding region P subjected to surface processing so as to be bonded to another electrode film and a non-bonding region Q not bonded to the another electrode film, and the bonding region P is formed in a weight connection pattern including weight shapes separated from each other on the first insulating layer, and the weight shapes on the first insulating layer of a first electrode film and the weight shapes on the first insulating layer of a second electrode film immediately below the first electrode film are stacked and arranged such that the weight shapes do not overlap each other in a stacking direction and that the weight shapes and in orientations such that the weight shapes are rotated by 90 degrees from each other, and the first electrode film and the second electrode film are bonded by the bonding region P of the first insulating layer of the second electrode film, so that the plurality of electrode films has electrode portions where the two electrode films are bonded and hinge portions where the two electrode films are not bonded when viewed from the stacking direction, and when the stacked electrostatic actuator is pulled in the stacking direction by an external force, the hinge portions are elastically deformed to separate electrode portions from each other and the stacked electrostatic actuator extends in the stacking direction, and when a voltage is applied between the conductor layers of the plurality of electrode films, a distance between electrode portions separated from each other is reduced by electrostatic force so that the stacked electrostatic actuator contracts in the stacking direction.

3. The stacked electrostatic actuator according to claim 1, wherein the hinge portions of each of the electrode films are formed as arcuate regions having a curvature radius $R_e$ of an outer periphery and a curvature radius $R_i$ of an inner periphery, and the arcuate regions each have a shape in which arcs are continuously connected while changing a curvature orientation for each opening angle $\theta_{OA}$ of the arcuate region.

4. The stacked electrostatic actuator according to claim 1, wherein the hinge portions of each of the electrode films are formed as arcuate regions having a curvature radius $R_e$ of an outer periphery and a curvature radius $R_i$ of an inner periphery, and an opening angle $\theta_{OA}$ of the arcuate region is 180 degrees or more.

5. The stacked electrostatic actuator according to claim 1, wherein with definition of a movement amount of one boundary C of each of the hinge portion with respect to another boundary C of the hinge portion in an extension/contraction direction of the stacked electrostatic actuator as a displacement of the hinge portion, and definition of a displacement of the hinge portion corresponding to a maximum allowable distance between the facing electrode portions defined by a generated force of the actuator as a maximum displacement, the maximum displacement of the hinge portions is $\sqrt{2}$ times or more a thickness of each of the electrode films.

6. The stacked electrostatic actuator according to claim 1, wherein the hinge portions have a uniform width.

7. The stacked electrostatic actuator according to claim 6, wherein a ratio of the width of the hinge portions to a thickness of the electrode films is 5 or more.

8. The stacked electrostatic actuator according to claim 1, wherein a space formed between two of the electrode films by the corresponding hinge portion is in fluid communication with an outside, and fluid is allowed to flow in and out between the space and the outside when the stacked electrostatic actuator extends and contracts.

* * * * *